United States Patent
Kotani et al.

(10) Patent No.: US 7,266,801 B2
(45) Date of Patent: Sep. 4, 2007

(54) DESIGN PATTERN CORRECTION METHOD AND MASK PATTERN PRODUCING METHOD

(75) Inventors: Toshiya Kotani, Machida (JP); Suigen Kyoh, Yokohama (JP); Hirotaka Ichikawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 151 days.

(21) Appl. No.: 11/012,613

(22) Filed: Dec. 16, 2004

(65) Prior Publication Data

US 2005/0235245 A1 Oct. 20, 2005

(30) Foreign Application Priority Data

Dec. 17, 2003 (JP) .............................. 2003-419600

(51) Int. Cl.
  *G06F 17/50* (2006.01)
(52) U.S. Cl. ............................................ 716/21; 716/4
(58) Field of Classification Search ................... 716/4; 355/18; 430/5, 30, 296; 438/706
See application file for complete search history.

(56) References Cited

U.S. PATENT DOCUMENTS

| | | | |
|---|---|---|---|
| 5,677,092 A * | 10/1997 | Takekuma et al. ............ 430/30 |
| 6,316,163 B1 * | 11/2001 | Magoshi et al. ............ 430/296 |
| 6,415,421 B2 | 7/2002 | Anderson et al. | |
| 6,470,489 B1 | 10/2002 | Chang et al. | |
| 6,507,931 B2 | 1/2003 | Kotani et al. | |
| 6,576,147 B2 | 6/2003 | Mukai | |
| 6,745,372 B2 | 6/2004 | Côté et al. | |
| 6,949,320 B2 * | 9/2005 | Miyagawa .................. 430/30 |
| 7,120,882 B2 * | 10/2006 | Kotani et al. .................. 716/5 |
| 2005/0085085 A1 * | 4/2005 | Borodovsky ................ 438/706 |
| 2005/0088633 A1 * | 4/2005 | Borodovsky .................. 355/18 |
| 2006/0051680 A1 * | 3/2006 | Tritchkov et al. .............. 430/5 |

FOREIGN PATENT DOCUMENTS

JP 2002-026126 1/2002
JP 2003-303742 A 10/2003

* cited by examiner

*Primary Examiner*—Leigh M. Garbowski
(74) *Attorney, Agent, or Firm*—Finnegan, Henderson, Farabow, Garrett & Dunner, L.L.P.

(57) ABSTRACT

There is disclosed a method of correcting a design pattern considering a process margin between layers of a semiconductor integrated circuit, including calculating a first pattern shape corresponding to a processed pattern shape of a first layer based on a first design pattern, calculating a second pattern shape corresponding to a processed pattern shape of a second layer based on a second design pattern, calculating a third pattern shape using a Boolean operation between the first and second pattern shapes, determining whether or not an evaluation value obtained from the third pattern shape satisfies a predetermined value, and correcting at least one of the first and second design patterns if it is determined that the evaluation value does not satisfy the predetermined value.

20 Claims, 10 Drawing Sheets

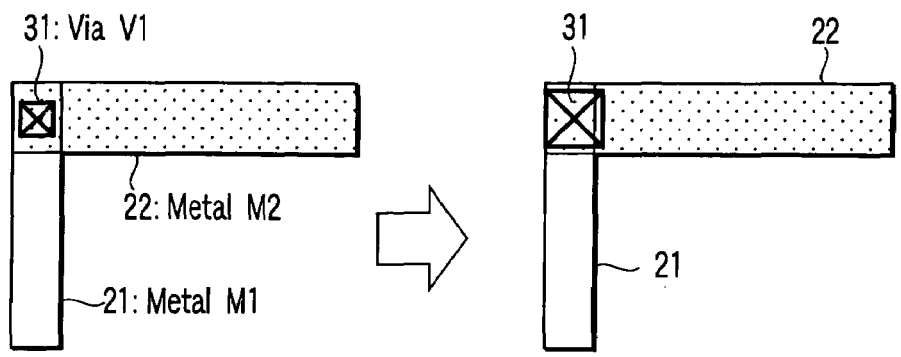
F I G. 5A
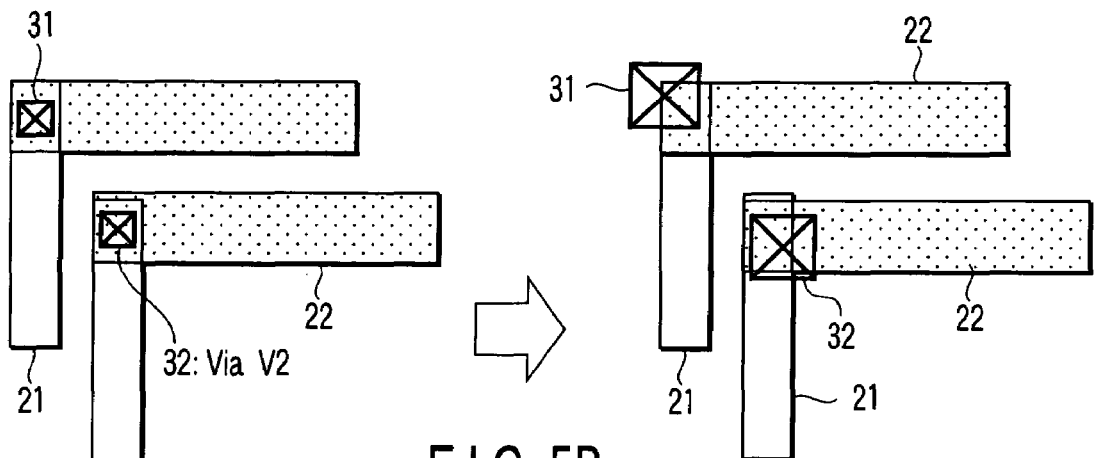
F I G. 5B
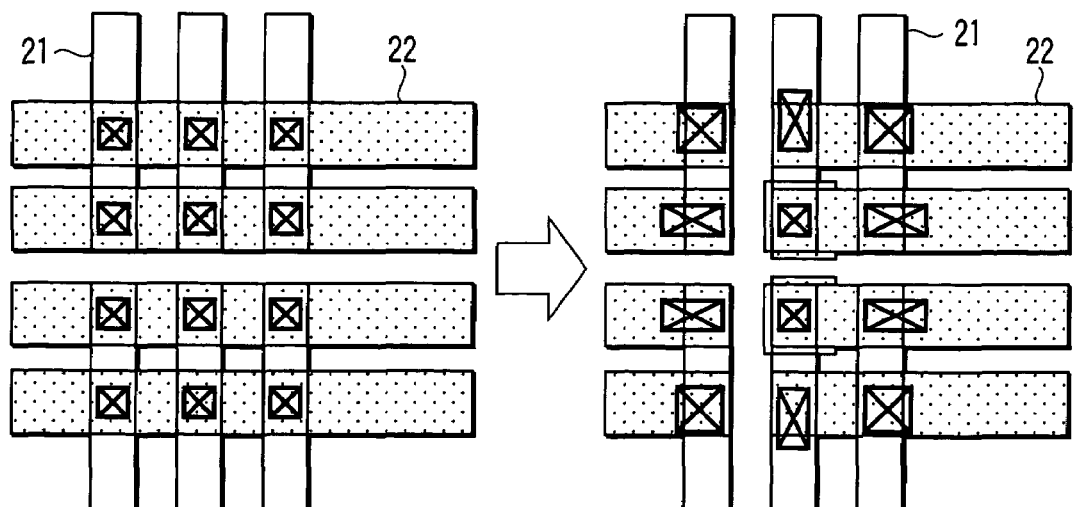
F I G. 5C

DESIGN PATTERN CORRECTION METHOD AND MASK PATTERN PRODUCING METHOD

CROSS-REFERENCE TO RELATED APPLICATIONS

This application is based upon and claims the benefit of priority from the prior Japanese Patent Application No. 2003-419600, filed Dec. 17, 2003, the entire contents of which are incorporated herein by reference.

BACKGROUND OF THE INVENTION

1. Field of the Invention

The present invention relates to a design pattern correction method of correcting a design pattern of a semiconductor integrated circuit. Moreover, the present invention relates to a mask pattern producing method of producing a mask pattern of a semiconductor integrated circuit.

2. Description of the Related Art

Recently, the technique of manufacturing semiconductor devices has remarkably advanced, and semiconductor devices having a minimum process dimension of 0.13 μm are mass-produced. The scale-down described above is realized by the great development of micro-pattern forming techniques such as mask process techniques, photolithography techniques and etching techniques.

In the large pattern size generation, an LSI pattern to be formed on a wafer is intactly used as a design pattern, and a mask pattern faithful to the design pattern is produced. The mask pattern is transferred onto the wafer using a projection optical system, thereby forming a pattern approximately equal to the design pattern on the wafer.

However, the scale-down of the pattern advances; for this reason, it is difficult to faithfully form a pattern in individual processes. As a result, a problem arises such that the final processed pattern shape is not provided as the design pattern.

In order to overcome the foregoing problem, so-called mask data processing is very important. More specifically, a mask pattern different from the design pattern is produced so that the final processed pattern dimensions become approximately equal to the design pattern.

The mask data processing includes the following processings. One is MDP processing of modifying the mask pattern using graphical operation and a design rule checker (D.R.C.). Another is optical proximity correction (OPC) for correcting the optical proximity effect (OPE). The foregoing processings are made, and thereby, the mask pattern is properly corrected so that the final processed pattern dimensions are provided as desired dimensions.

In recent years, a k1 value ($k1=W/(NA/\lambda)$) becomes smaller and smaller in the lithography process with the scale-down of device patterns. (In the foregoing equation, W: design pattern dimension, $\lambda$: exposure wavelength of exposure system, and NA: numerical aperture of a lens used for the exposure system.) As a result, there is a tendency for the influence of the OPE to increase. For this reason, a very heavy load is given to the OPC.

In order to achieve high accuracy of the OPC, a model-based OPC is mainly employed. According to the model-based OPC, a proper correction value is calculated using a light intensity simulator capable of accurately predicting the OPE. A model-based OPC verification technique using lithography simulation is very important to verify a mask subjected to complicated model-based OPC.

For example, there have been proposed techniques of applying the model-based OPC verification technique to a single layer to detect a dangerous pattern having a small lithography margin (see U.S. Pat. No. 6,470,489 and U.S. Pat. No. 6,415,421). However, according to the foregoing techniques, sufficient detection accuracy is not obtained. In addition, development is still not made with respect to a technique of determining whether or not a sufficient lithography margin is secured between several layers.

Consequently, it is difficult to secure a sufficient processed shape in the conventional case. In addition, if a sufficient processed shape is secured, the problem arises such that the layout area increases; as a result, the chip size also increases.

BRIEF SUMMARY OF THE INVENTION

According to a first aspect of the present invention, there is provided a method of correcting a design pattern considering a process margin between layers of a semiconductor integrated circuit, comprising: calculating a first pattern shape corresponding to a processed pattern shape of a first layer based on a first design pattern; calculating a second pattern shape corresponding to a processed pattern shape of a second layer based on a second design pattern; calculating a third pattern shape using a Boolean operation between the first and second pattern shapes; determining whether or not an evaluation value obtained from the third pattern shape satisfies a predetermined value; and correcting at least one of the first and second design patterns if it is determined that the evaluation value does not satisfy the predetermined value.

According to a second aspect of the present invention, there is provided a method of producing a mask pattern considering a process margin between layers of a semiconductor integrated circuit, comprising: resizing a first design pattern of a first layer at least one time to produce a first mask pattern; resizing a second design pattern of a second layer at least one time to produce a second mask pattern; calculating a first pattern shape corresponding to a processed pattern shape of the first layer based on the first mask pattern; calculating a second pattern shape corresponding to a processed pattern shape of the second layer based on the second mask pattern; calculating a third pattern shape using a Boolean operation between the first and second pattern shapes; determining whether or not an evaluation value obtained from the third pattern shape satisfies a predetermined value; and correcting at least one of the first and second mask patterns if it is determined that the evaluation value does not satisfy the predetermined value.

According to a third aspect of the present invention, there is provided a system of correcting a design pattern considering a process margin between layers of a semiconductor integrated circuit, comprising: means for calculating a first pattern shape corresponding to a processed pattern shape of a first layer based on a first design pattern; means for calculating a second pattern shape corresponding to a processed pattern shape of a second layer based on a second design pattern; means for calculating a third pattern shape using a Boolean operation between the first and second pattern shapes; means for determining whether or not an evaluation value obtained from the third pattern shape satisfies a predetermined value; and means for correcting at least one of the first and second design patterns if it is determined that the evaluation value does not satisfy the predetermined value.

According to a fourth aspect of the present invention, there is provided a computer readable medium configured to store program instructions applied to correcting a design pattern considering a process margin between layers of a semiconductor integrated circuit, the program instructions causing a computer to calculate a first pattern shape corresponding to a processed pattern shape of a first layer based on a first design pattern; causing a computer to calculate a second pattern shape corresponding to a processed pattern shape of a second layer based on a second design pattern; causing a computer to calculate a third pattern shape using a Boolean operation between the first and second pattern shapes; causing a computer to determine whether or not an evaluation value obtained from the third pattern shape satisfies a predetermined value; and causing a computer to correct at least one of the first and second design patterns if it is determined that the evaluation value does not satisfy the predetermined value.

BRIEF DESCRIPTION OF THE SEVERAL VIEWS OF THE DRAWING

FIGS. 5A to 5C are views each showing an example of the arrangement of metal interconnect and via;

DETAILED DESCRIPTION OF THE INVENTION

Embodiments of the present invention will be described below with reference to the accompanying drawings.

(First Embodiment)

Figure 1:
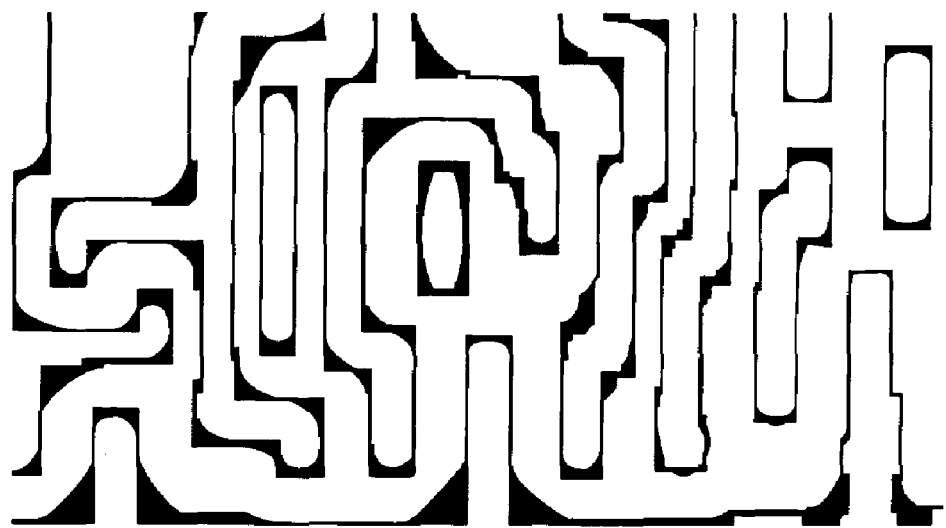
FIG. 1 is a view showing a processed pattern shape when OPC is made with respect to a single layer.

FIG. 1 is a view showing the result when OPC is made with respect to a single layer. In this case, a metal interconnect (M1) layer is assumed. In FIG. 1, portions painted with black show deviations from a design pattern (target pattern) of the pattern after OPC.

Figure 2:
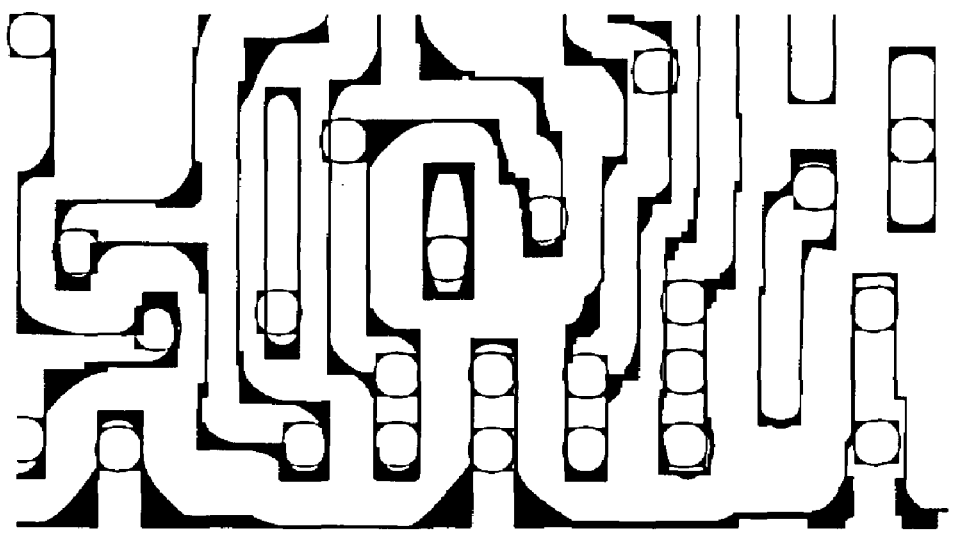
FIG. 2 is a view showing a processed pattern shape when OPC is made with respect to several layers.

FIG. 2 is a view showing the result when OPC is made with respect to several layers. A metal interconnect (M1) is assumed as a first layer based on a first design pattern. A contact hole (CS) is assumed as a second layer based on a second design pattern. The best condition is given with respect to exposure dose and focal position. In FIG. 2, an overlay error between M1 and CS is not considered.

An AND region of a processed pattern shape of the M1 and that of the CS require a predetermined area or more. For example, the area of an AND region of the design pattern of the M1 and that of the CS is set as A1. In addition, the area of the AND region of the processed pattern shape of the M1 and that of the CS is set as A2. In this case, an area ratio (A2/A1) of A2 to A1 needs to have a predetermined value or more. In the following description, the area ratio is referred to simply as area.

Figure 3:
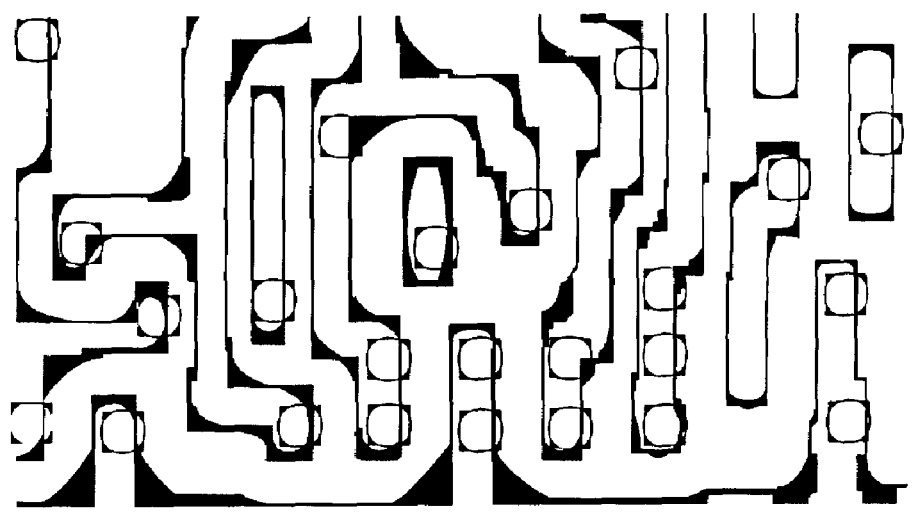
FIG. 3 is a view showing a processed pattern shape taking an alignment error between several layers into consideration.

In fact, an overlay error is generated between M1 and CS in exposure. For this reason, the processed pattern shape (first pattern shape) of the M1 and the processed pattern shape (second pattern shape) of the CS are out of the alignment position as seen from FIG. 3. Even if the foregoing case is given, the area of the AND region needs to have a predetermined value or more. If the area of the predetermined value or more is not secured, the design pattern (design rule) or mask pattern must be corrected. In other words, it is necessary to make corrections of increasing the area of the AND region.

The correction methods are as follows.

Figures 4A, 4B:
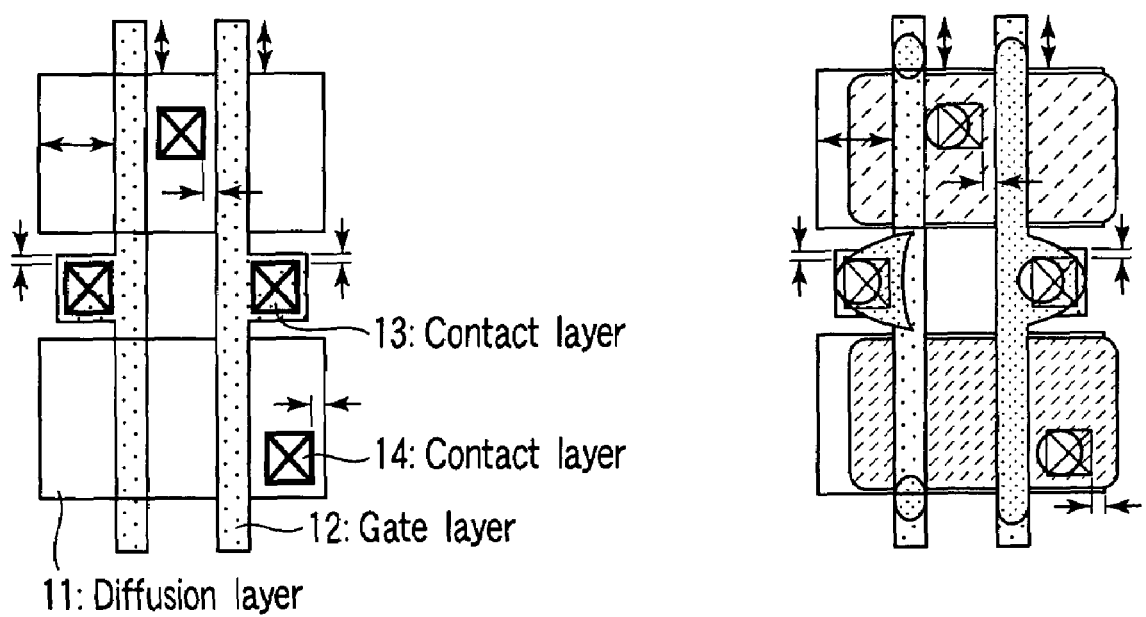
FIG. 4A and FIG. 4B are views to explain contact layer, gate layer and diffusion layer.

(1) Widen the width of the metal interconnect (2) Make large the diameter of a contact hole In the foregoing method (2), a layer connected with the contact hole should be considered. FIG. 4A shows a design layout, and FIG. 4B shows a processed pattern shape on a wafer. In FIG. 4A and FIG. 4B, a reference numeral 11 denotes a diffusion layer, 12 denotes a gate layer, 13 denotes a contact layer connected to the gate layer 12, and 14 denotes a contact layer connected to the diffusion layer 11.

For example, a contact hole for connecting a metal layer (metal interconnect layer) and the gate layer or for connecting the metal layer and the diffusion layer (source/drain diffusion layer) is formed. In this case, the contact hole is formed larger than a desired size. For this reason, the contact hole pattern bulges from the pattern of the gate layer or diffusion layer.

Therefore, if the foregoing method (2) is employed, a distance between the contact hole pattern and the gate pattern (distance in design pattern or processed pattern shape) must be considered. In addition, corrections on the diameter of the contact hole must be estimated considering a degree of overlay error.

If a contact hole is formed to connect metals M1 and M2 (first-layer and second-layer metal interconnects) (hereinafter, the contact hole is called a via), the same consideration as described above is required. For example, if a via V1 is made large in order to sufficiently secure the AND region of the metal M1 and the via V1, an area for connecting the via V1 and the metal M2 becomes large. If another via V2 is arranged near the metal M2, the via V1 is made large, and thereby, the distance between the vias V1 and V2 becomes narrow. As a result, there is a possibility that the vias V1 and V2 contact with each other.

Therefore, if the via V1 is made large, the determinations given below should be made.

(1) Determine whether another via V2 exists near the via V1

(2) Determine whether the via V2 exists which direction with respect to the via V1

(3) Determine whether contact of the via V2 with the via V1 may be made (There is no problem, even if the contact is made, so long as they have the same potential.)

Based on the determination result, the size (dimension) and enlargement direction of the via V1 must be determined.

FIGS. 5A to 5C each show the arrangement of the via and the metal. FIG. 5A shows the case where no via V2 exists near the via V1. FIG. 5B shows the case where via V2 exists at one side of the via V1. FIG. 5C shows the case where via V2 exists in the vicinity of the via V1 and the case where no via V2 exists therein. In these figures, a reference numeral 21 denotes a first metal interconnect (M1), 22 denotes a second metal interconnect (M2), 31 denotes a first via (V1), and 32 denotes a second via (V2).

In the case of FIG. 5A, the via V1 (via 31) can be simply enlarged. In the case of FIG. 5B, the via 31 can be enlarged to the direction opposite to the existing direction of the via 32 in order to prevent contact of the via V1 (via 31) with via V2 (via 32). In the case of FIG. 5C, vias capable of being enlarged are enlarged, and if vias incapable of being enlarged exist, each width of the metals M1 and M2 is widened. In FIG. 5C, another via exists in the vicinity of two vias existing in the center; for this reason, the tip portion of the metal interconnect 22 is formed wider. Ten vias around the center two vias are each enlarged to a direction where another via does not exist in the vicinity.

Usually, the metal interconnects and vias are placed using a placement and routing (P&R) tool. In the first embodiment, the procedures given below are taken. More specifically, a system having the foregoing P&R tool calculates the processed pattern shape of via and metal on a wafer. The preceding determinations (1) to (3) are made based on the calculated result, and based on the determination result, at least one of the metal and via is enlarged. By doing so, it is possible to sufficiently secure the AND region of a metal pattern and a via pattern.

A conventional P&R tool has carried out a procedure such that the routing length becomes shorter as much as possible based on placement and routing information. In this case, the information includes layout information of standard and macro cells and layout connection information. The system of the first embodiment has the following function in addition to the function described above. That is, the system has a function of correcting the cell and macro layout and the layout shape after placement to sufficiently secure the AND region of processed pattern shapes of metal and via. A compaction tool may be used for correcting the layout shape, which is capable of producing and correcting a layout according to a previously given layout preparing (design) rule.

Figure 6:
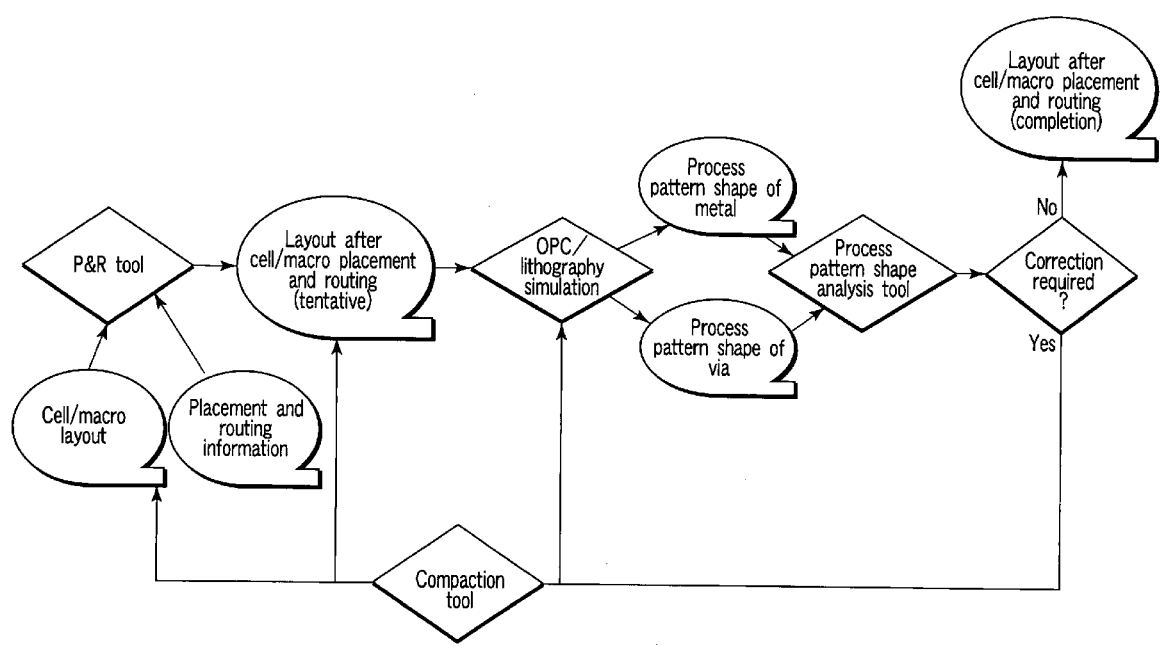
FIG. 6 is a view to explain a design layout system combining P&R tool, OPC tool, lithography verification tool and compaction tool.

FIG. 6 is a view showing the functional configuration of the foregoing system. The system is used, and thereby, it is possible to secure a connection of metal and via, which has not been secured in the conventional placement and routing process. Further, it is possible to automatically produce a design layout and a mask pattern considering OPC. In other words, it is possible to obtain a design pattern having a layout size smaller than the conventional case and a secured processed pattern shape.

The design layout producing system using the foregoing P&R tool and compaction tool is given as one example. Even if these tools are not used, any other systems may be used so long as the design layout is automatically corrected based on the processed pattern shapes of metal and via.

If the processed pattern shape is determined as defective, some factors should be considered. In accordance with the factors, the following cases are given. One is the case of correcting the design pattern, and another is the case of correcting the mask pattern. The foregoing cases will be described below with reference to the flowchart of FIG. 7.

The metal layer (M1) and the contact layer (CS) are singly evaluated (S11, S13, S21, S23). By doing so, it is determined whether or not a predetermined process margin is secured in each of the metal layer and the contact layer. If the preceding condition is not satisfied, the mask pattern and the design pattern are changed (S12, S14, S22, S24). Incidentally, the detailed process flow has been disclosed in JPN. PAT. APPLN. KOAKI No. 2002-26126 and No. 2003-303742.

M1 and CS are individually moved by half of an alignment error (S15, S25). Thereafter, AND processing of M1 and CS after moved is carried out (S31). Further, an area of the AND processing portion is calculated (S32). If the area of the AND processing portion is smaller than a predetermined value, a fringe is added to the M1 pattern and the CS pattern (S33), and thereafter, the process flow returns to steps S11 and S21. On the other hand, if the area of the AND processing portion is larger than the predetermined value, the layout of M1 and CS is completed (S34).

The foregoing procedures are taken, and thereby, it is possible to secure each processed pattern shape of the metal layer and the contact layer, and to secure a processed pattern shape considering the interactive relationship between the metal and contact layers.

Figure 7:
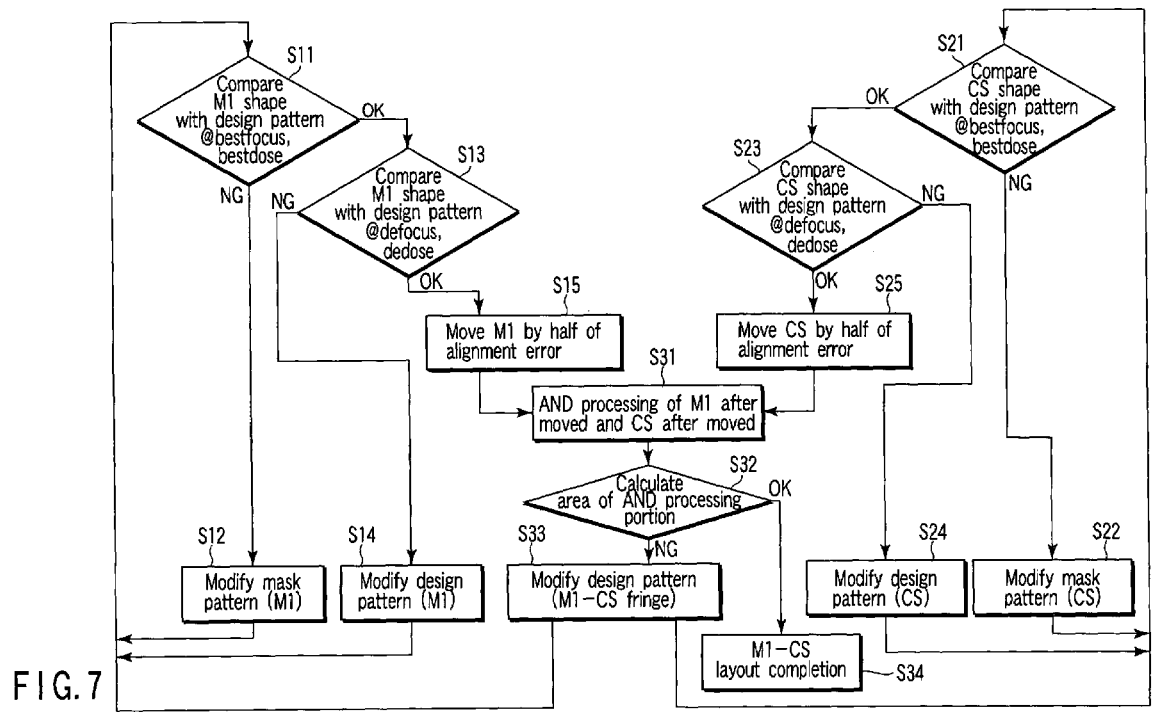
FIG. 7 is a view to explain the flow of verification procedures taken with respect to several layers.

The example corresponding to the process flow shown in the flowchart of FIG. 7 will be described below with reference to FIG. 8.

First, each design pattern of metal and contact is given (1). Resizing including OPC and Boolean operation are carried out with respect to the design pattern to produce each mask pattern of the metal and the contact (2). Further, a processed pattern shape on a wafer of the metal and contact is predicted from the mask pattern (3). An alignment error of the contact with the metal is set as a, and a processed pattern dimension of a target contact is set as w. In this case, there is a possibility that the contact is formed at a position shifted from the position predicted in the step (3) by a (4, 5).

A ring pattern shown in step (5) shows the existing region of the contact with respect to the alignment error a. The ring pattern is overlaid with the processed pattern shape of metal, and thereby, it is important to obtain an overlay region (third pattern shape).

If the overlay region is small, it is difficult to sufficiently secure a connection of contact and metal; as a result, the yield is reduced. Conversely, if the overlay region has a sufficient area, the sure connection is secured. The overlay region is obtained from AND processing of the ring pattern region and the processed pattern shape of metal (6). The area of the overlay region is calculated using a general design rule checker (DRC) tool (7).

The area obtained in the foregoing step (7) is evaluated. More specifically, the area obtained in step (7) is compared with a predetermined area tolerance (8). If the area obtained in step (7) is smaller than the predetermined area tolerance, the design pattern should be changed. For this reason, a correction guideline to the design pattern modification (correction) is prepared, and design rule and design pattern are modified according to the correction guideline (S9). By doing so, a new design layout is produced (10). The foregoing procedures are repeated until the condition of the step (8) is satisfied. If the area obtained in step (7) finally becomes larger than the predetermined area tolerance, the layout is completed (11).

Figure 8:
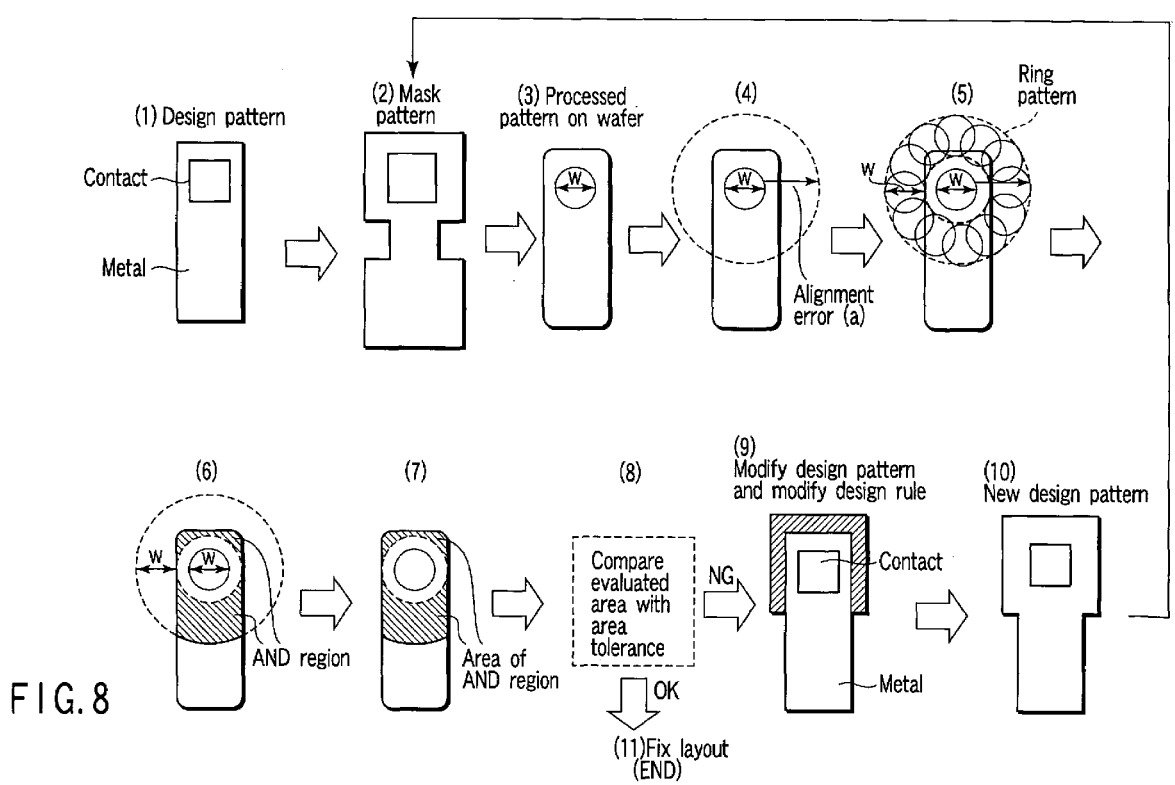
FIG. 8 is a view showing a specific example of the flow of verification procedures taken with respect to several layers.
Figure 9:
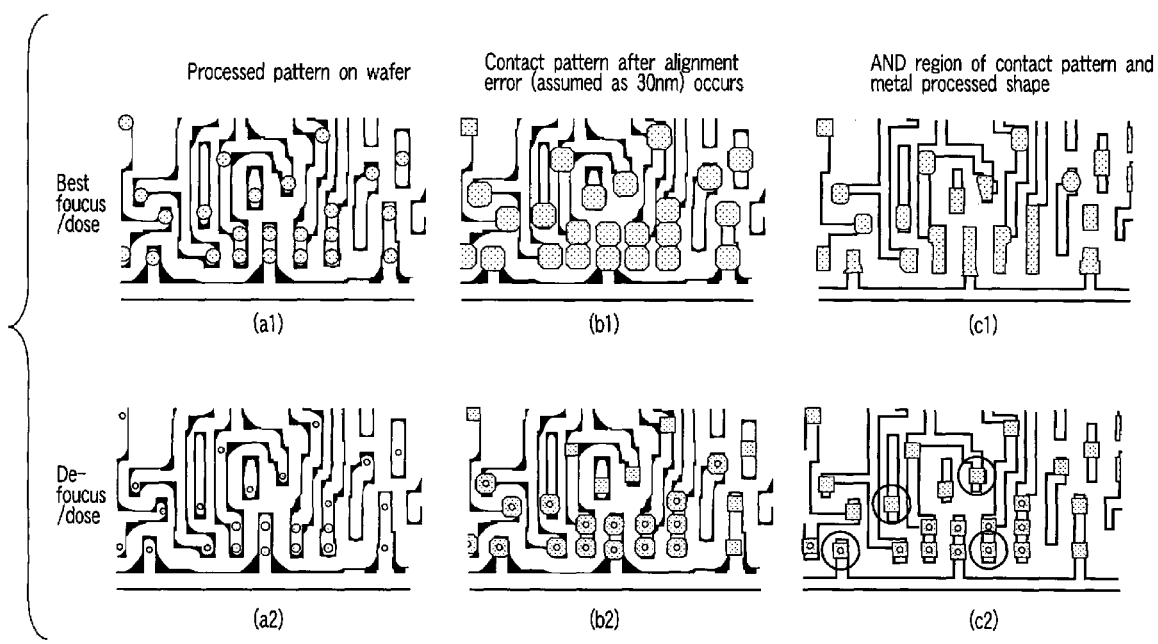
FIG. 9 is a view showing the results applied to actual layouts.

FIG. 9 shows examples in which the procedures shown in FIG. 8 are carried out with respect to actual layouts. In FIG. 9, (a1), (b1) and (c1) are examples when a contact pattern is formed under the condition of the best focus and the best dose. In FIG. 9, (a2), (b2) and (c2) are examples when the contact pattern is formed under the condition shifted slightly from the best focus and the best dose. The metal pattern is formed under the condition of the best focus and the best dose.

In the example shown in FIG. 9, only dose and focus are varied for simplification. In this case, at least one or more process parameters influencing the processed pattern shape may be varied. The following parameters are given as the process parameter in addition to focus and dose. The parameters include exposure wavelength of exposure system, numerical aperture of a lens of the exposure system, and aberration of lens. Further, the parameters include, transmittance of lens, illumination shape of the exposure system, intensity distribution of illumination light, and etching conversion difference.

Patterns (ai), (bi) and (ci) of FIG. 9 correspond to (3), (5) and (7) shown in FIG. 8, respectively. The area calculated in step (7) of FIG. 8 is obtained using the DRC tool, and patterns having an area incapable of satisfying the tolerance are surrounded with a circle. Thus, only design pattern of the patterns surrounded with the circle are corrected, and thereafter, evaluation is again made via the same flow. As a result, dangerous patterns are avoided without increasing the chip size.

According to the first embodiment, the first pattern shape corresponding to the processed pattern shape of the first layer is calculated based on the first design pattern. The second pattern shape corresponding to the processed pattern shape of the second layer is calculated based on the second design pattern. The Boolean operation is carried out with respect to the first and second pattern shapes to calculate the third pattern shape. Then, it is determined whether or not the evaluation value obtained from the third pattern shape satisfies the predetermined value. If it is determined that the evaluation value does not satisfy the predetermined value, correction is made with respect to at least one of the first and second design patterns. By doing so, the chip size is made smaller than the conventional case, and a design pattern securing the processed pattern shape is obtained. In other words, verification is made whether margin is sufficient based on the relationship between processed pattern shapes of several layers. By doing so, layout optimization for individual patterns is possible although it is difficult in the conventional case, and the chip area is reduced. Therefore, the present embodiment is sufficiently applicable to microfabrication of semiconductor integrated circuits in a new generation.

(Second Embodiment)

The second embodiment of the present invention will be described below.

Figure 10:
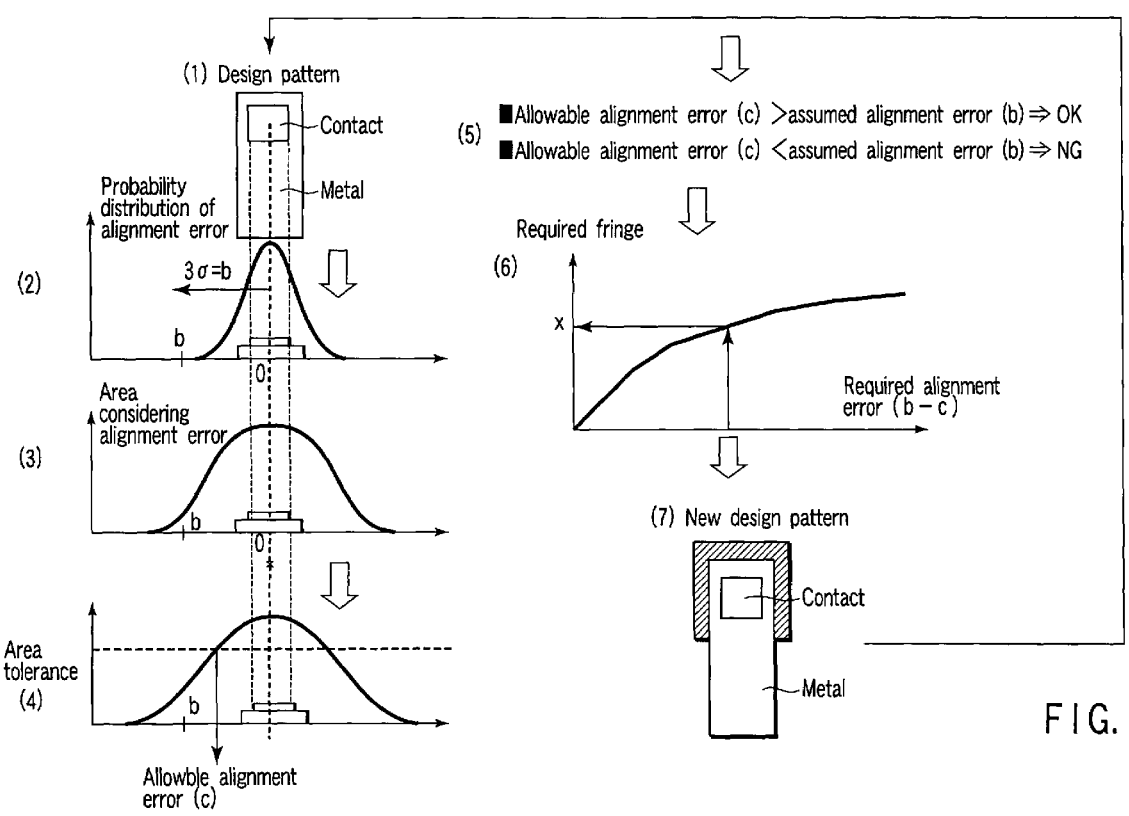
FIG. 10 is a view to explain a feedback process to design pattern when probability distribution of alignment error is taken into consideration.

In FIG. 8, an assumption is given such that the alignment error a uniformly distributes; however, in fact, the alignment error (a) depends on a probability distribution. FIG. 10 shows one example when the probability distribution of the alignment error is a normal distribution, and 3σ is set as b.

The probability distribution of the alignment error is a normal distribution of 3σ=b; therefore, a probability distribution shown in FIG. 10 (2) is given. The area of the AND region of ring pattern and metal pattern in each alignment error position is calculated according to the method shown in FIG. 8 and FIG. 9. When an area calculated in each alignment error position is taken as the vertical axis, an area distribution shown in FIG. 10 (3) is given. Convolution integral of the probability distribution (2) and the area (3) is made. By doing so, an effective area distribution (4) of the AND region of ring pattern and metal pattern when alignment error occurs in the probability distribution (2) is calculated.

Values (area tolerance) required for the effective area distribution are determined according to device specifications and experiments. An allowable alignment error (c) capable of securing the area tolerance is calculated. Thereafter, it is determined whether or not the allowable alignment error (c) is larger than a presumed alignment error (b). If the allowable alignment error c is smaller than the preceding b, the pattern may be actually shifted by b; nevertheless, the alignment error must be reduced to (c). Therefore, the following three points must be considered so that the b value becomes smaller than the c value.

(A) Improve alignment accuracy to reduce the value of $3\sigma=b$ (B) Reconsider area tolerance (C) Increase effective area In the foregoing point (A), a target having desired alignment accuracy must be reconsidered. In the foregoing point (B), it must be reconsidered whether or not the area tolerance regulated from device specifications is truly correct. Therefore, relatively much time is spent for the reconsiderations described above. Thus, the foregoing point (C) is the simplest way. More specifically, the effective area distribution of the AND region of ring pattern and metal pattern is increased as a whole. In order to increase the effective area distribution, the following methods are given. One is a method of increasing a metal fringe, and another is a method of increasing a contact area. If the contact size is changed, the positional relationship must be considered with respect to other layers (e.g., gate layer). Therefore, the method of increasing a metal fringe is the best way in fact.

For example, a graph (6) is prepared taking a required alignment error (absolute value of b–c) as the horizontal axis and taking a required fringe (x) as the vertical axis. A new design layout (7) to which the fringe is added is prepared based the foregoing graph. The new design layout is replaced with the design layout (1), and thereafter, the same evaluation as described above is made. The evaluation is repeated until the alignment error (c) becomes equal to (b), or larger than (b). The procedures described above are made with respect to all contact holes, and thereby, a proper fringe is given to each contact hole. As a result, the chip size is made smaller than the conventional case.

As described above, the alignment error occurs according to a probability distribution. Therefore, the procedures described in FIG. 8 and FIG. 9 are taken considering the probability distribution, and thereby, it is possible to correct the layout with high accuracy.

(Third Embodiment)

Figure 11A:
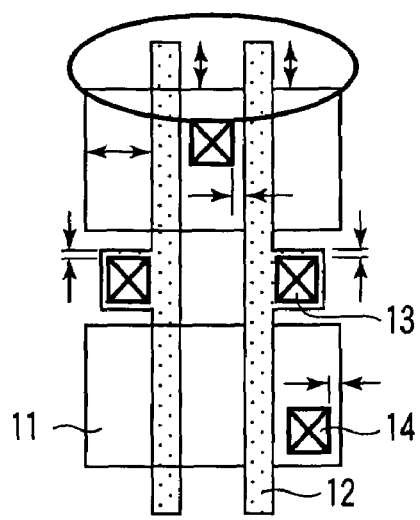
FIG. 11A and FIG. 11B are views to explain the relationship between gate layer, diffusion layer and contact layer.
Figure 11B:
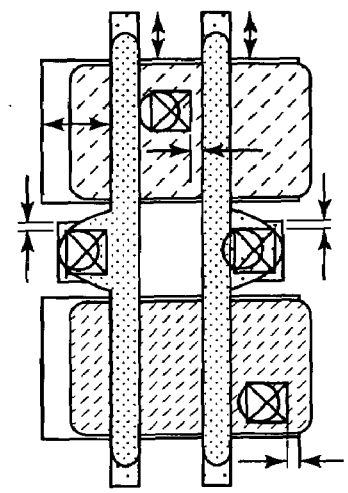
Figure 12A:
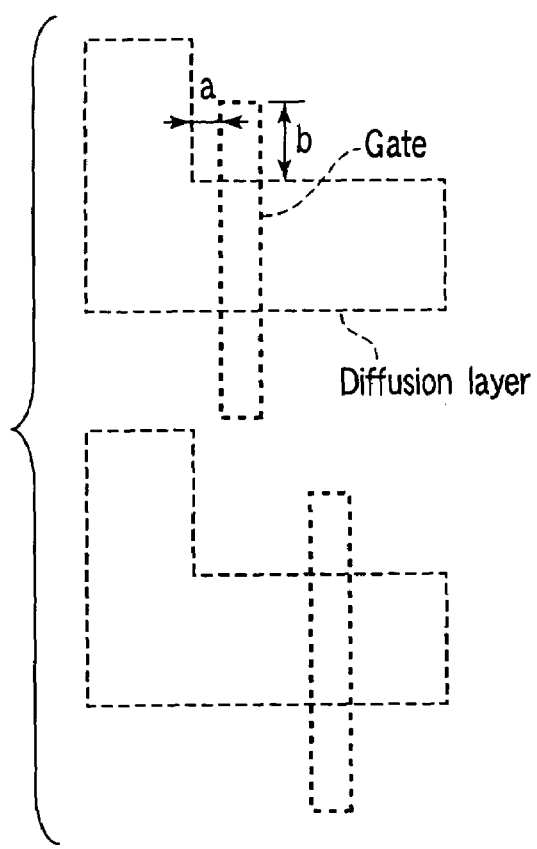
FIG. 12A and FIG. 12B are views to explain the relationship between processed pattern shapes of a gate tip portion and a diffusion layer.
Figure 12B:
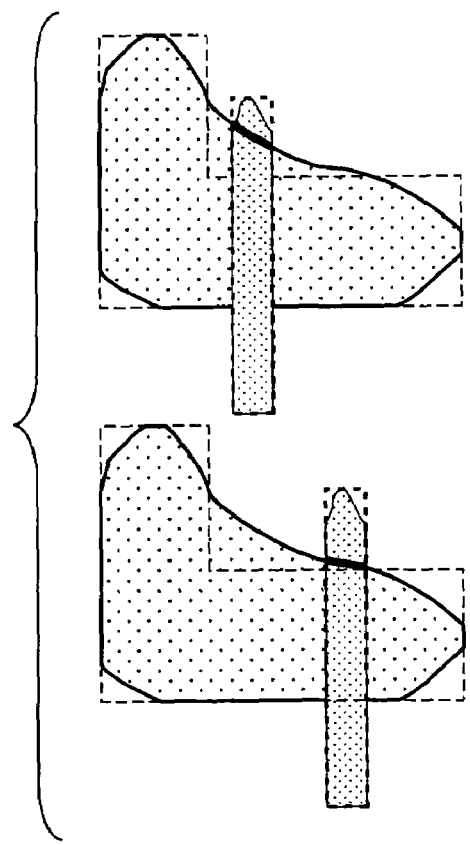

FIG. 11A, FIG. 11B, FIG. 12A and FIG. 12B are views to explain a third embodiment of the present invention. FIG. 11A and FIG. 12A each show a design layout, and FIG. 11B and FIG. 12B each show a processed pattern shape on a wafer. In FIG. 11A, a reference numeral 11 denotes a diffusion layer, 12 denotes a gate layer, 13 and 14 denote contact layers. In FIG. 12A and FIG. 12B, upper-side views show the case where a distance (a) is short, and lower-side views show the case where the distance (a) is long.

The embodiment is applicable to evaluation based on each processed shape of gate layer, diffusion layer and contact layer. The criterion for layout corrections of metal layer and contact layer is as follows. That is, the area of the AND region of these layers is used as an index, and it is determined whether or not the area is more than a predetermined value. In particular, a gate line tip portion surrounded with a circle in FIG. 11A has a problem in the gate layer and the diffusion layer. In order to hold the gate characteristic, it is important that a desired gate width is secured in the boundary between the gate line and the diffusion layer.

As shown in the upper-side view of FIG. 12A, the layout shape at the gate line end portion is determined depending on a distance (a) from the diffusion layer end and a gate projecting distance (b) from the diffusion layer end. The distance (b) is determined according to rounding at the corner of the diffusion layer and shortening of the gate tip portion. The rounding of the diffusion layer is variable in accordance with the distance (a); for this reason, the value of (b) depends on the value of (a). The value of (b) is made small, and thereby, the chip area is also made small. Therefore, it is preferable that the value of (b) is a necessary and minimum value.

In order to determine the foregoing minimum (b) value, the process flow given below is carried out.

(1) Calculate a processed pattern shape of the gate layer (2) Calculate a processed pattern shape of the diffusion layer (3) Subtract an overlay portion with the diffusion layer in the processed pattern shape of the gate layer (corresponding to NOT processing in Boolean operation)

(4) Measure the length of the boundary subjected to NOT processing (5) Determine whether or not the length of the boundary obtained in step (4) is within a predetermined range (6) Measure a chip area if the length is within a predetermined range (7) End if the chip area satisfies a predetermined value using the present given (b) value (8) Reduce the (b) value (reduce the chip area) if the chip area does not satisfy a predetermined value using the present given (b) value, and take the procedures from step (1) again (9) Make layout correction such that the (a) or (b) value of FIG. 12 is made large if the length of the boundary is not within the predetermined range in step (5)

(10) Verify the layout obtained in step (9) from step (1) again.

The foregoing process flow is carried out, and thereby, it is important to determine the value of (b) to satisfy the required area of chip. The value of (b) is determined according to the foregoing process flow, and thereby, the chip area is greatly reduced as compared with the predetermined value.

The preceding process flow is applicable to cases other than above. For example, the process flow is applicable to the relationships between contact layer and diffusion layer, between contact layer and gate layer, and between contact layer and ion implantation layer. As a result, it is possible to produce a layout pattern smaller than the design layout pattern prepared based on the conventional design rule layout guideline, and to reduce the chip area.

Figure 13:
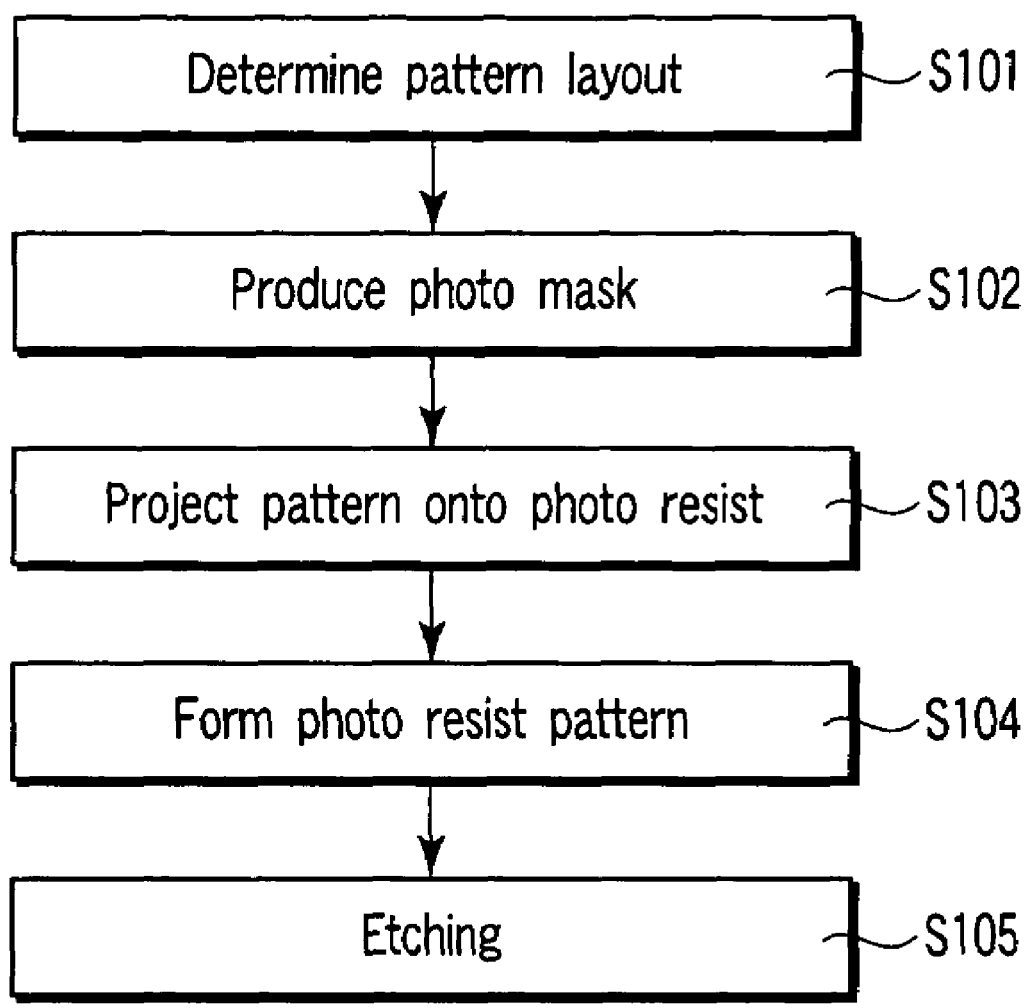
FIG. 13 is a flowchart to explain a method of manufacturing a mask and a method of manufacturing a semiconductor device.

A mask pattern based on the design pattern obtained according to the methods described in foregoing first to third embodiments is formed on a mask substrate, and thereby, a photo mask is manufactured. A semiconductor device (semiconductor integrated circuit) is manufactured using the mask pattern formed on the mask substrate. FIG. 13 is a flowchart to explain the foregoing methods.

A pattern layout (design layout) is determined according to the methods described in the foregoing first to third embodiments (S101). Thereafter, a mask pattern is formed on a mask substrate based on the determined pattern layout, and thereby, a photo mask is produced (S102). The mask pattern on the photo mask is projected onto a photo resist on a wafer (semiconductor substrate (S103). Then, the photo resist is developed to form a photo resist pattern (S104). A conductive film or an insulation film on the semiconductor substrate are etched using the photo resist pattern as a mask, and thereby, a desired pattern is formed (S105).

The mask pattern and the semiconductor device are manufactured based on the design layout obtained according to the methods described in the foregoing first to third embodiments. By doing so, it is possible to obtain mask and semiconductor device having a reduced layout as compared with the conventional case.

The foregoing first to third embodiments can be used for designing cell library.

According to the foregoing first to third embodiments, the design pattern is corrected considering a process margin between two layers. In this case, the design pattern may be corrected considering a process margin between three layers or more.

In the foregoing first to third embodiments, the photolithography process is given as one example. In this case, the same method as described above is applicable to X-ray exposure and electron beam (EB) exposure.

The procedures of the methods described in the first to third embodiments are realized using a computer, whose operation is controlled according to a program stored with the procedures of the methods. The program is provided using a recording medium such as a magnetic disk or communication network such as the Internet (wired or wireless line).

In the first to third embodiments, the following method is applicable in general.

More specifically, the first pattern shape is calculated from a mask pattern obtained by subjecting resizing including optical proximity correction to the first design pattern.

The second pattern shape is calculated from a mask pattern obtained by subjecting resizing including optical proximity correction to the second design pattern.

The Boolean operation is carried out after at least one of the first and second pattern shapes is moved or resized.

The Boolean operation is carried out considering an alignment error between the first and second layers.

The Boolean operation is carried out considering a probability distribution of the alignment error between the first and second layers.

The Boolean operation includes at least one of an AND operation and a NOT operation.

The evaluation value includes at least one of the area, peripheral line length and pattern width of the third pattern shape. The area, peripheral line length and pattern width may include their mean value or dispersion.

At least one of the first and second pattern shapes is calculated considering a predetermined process condition. The predetermined process condition includes at least one of parameters given below. The parameters are illumination light wavelength of exposure system, numerical aperture of a lens of the exposure system, illuminator shape thereof, focal position thereof, and aberration of lens thereof. Further, the parameters are exposure dose on wafer by the exposure system, alignment error, mask dimension and diffusion length of acid contained in resist.

The first and second layers each correspond to one of gate layer, interconnect layer, contact layer, diffusion layer, ion implantation layer and well layer.

The procedure from calculating of the first pattern shape to correcting at least one of the first and second design patterns is repeated until the evaluation value satisfies the predetermined value.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of correcting a design pattern considering a process margin between layers of a semiconductor integrated circuit, comprising:
    calculating a first pattern shape corresponding to a processed pattern shape of a first layer based on a first design pattern;
    calculating a second pattern shape corresponding to a processed pattern shape of a second layer based on a second design pattern;
    calculating a third pattern shape from the first and second pattern shapes;
    determining whether or not an evaluation value obtained from the third pattern shape satisfies a predetermined value; and
    correcting at least one of the first and second design patterns if it is determined that the evaluation value does not satisfy the predetermined value.

2. The method according to claim 1, wherein the first pattern shape is calculated from a mask pattern obtained by subjecting the first design pattern to resizing including optical proximity correction.

3. The method according to claim 1, wherein the second pattern shape is calculated from a mask pattern obtained by subjecting the second design pattern to resizing including optical proximity correction.

4. The method according to claim 1, wherein the evaluation value includes at least one of area, peripheral line length and pattern width of the third pattern shape.

5. The method according to claim 1, wherein at lease one of the first and second pattern shapes is calculated considering a predetermined process condition, and the predetermined process condition includes at least one of illumination light wavelength of exposure system, numerical aperture of a lens of the exposure system, illumination shape thereof, focal position thereof, aberration of lens thereof, exposure dose on wafer by the exposure system, alignment error amount, mask dimension and diffusion length of acid contained in resist.

6. The method according to claim 1, wherein the first and second layers each correspond to one of gate layer, interconnect layer, contact layer, diffusion layer, ion implantation layer and well layer.

7. The method according to claim 1, wherein procedures from calculating the first pattern shape to correcting at least one of the first and second design patterns are repeated until the evaluation value satisfies the predetermined value.

8. A method of manufacturing a mask comprising:
    forming a mask pattern based on a design pattern corrected by the method according to claim 1 on a mask substrate.

9. A method of manufacturing a semiconductor device, comprising:
    projecting the mask pattern obtained by the method according to claim 8 to a photo resist on a wafer.

10. The method according to claim 1, wherein calculating the third pattern shape includes calculating the third pattern shape using a Boolean operation between the first and second pattern shapes.

11. The method according to claim 10, wherein the Boolean operation is carried out after at least one of the first and second pattern shapes is moved or resized.

12. The method according to claim 10, wherein the Boolean operation is carried out considering an alignment error between the first and second layers.

13. The method according to claim 10, wherein the Boolean operation is carried out considering a probability distribution of an alignment error between the first and second layers.

14. The method according to claim 10, wherein the Boolean operation includes at least one of an AND operation and a NOT operation.

15. A method of producing a mask pattern considering a process margin between layers of a semiconductor integrated circuit, comprising:
    resizing a fist design pattern of a first layer at least one time to produce a first mask pattern;
    resizing a second design pattern of a second layer at least one time to produce a second mask pattern;
    calculating a first pattern shape corresponding to a processed pattern shape of the first layer based on the first mask pattern;
    calculating a second pattern shape corresponding to a processed pattern shape of the second layer based on the second mask pattern;
    calculating a third pattern shape from the first and second pattern shapes;
    determining whether or not an evaluation value obtained from the third pattern shape satisfies a predetermined value; and
    correcting at least one of the first and second mask patterns if it is determined that the evaluation vale does not satisfy the predetermined value.

16. The method according to claim 15, wherein calculating the third pattern shape includes calculating the third pattern shape using a Boolean operation between the first and second pattern shapes.

17. A system of correcting a design pattern considering a process margin between layers of a semiconductor integrated circuit, comprising:
    a first calculating part calculating a first pattern shape corresponding to a processed pattern shape of a first layer based on a first design pattern;
    a second calculating part calculating a second pattern shape corresponding to a processed pattern shape of a second layer based on a second design pattern;
    a third calculating part calculating a third pattern shape from the first and second pattern shapes;
    a determining part determining whether or not an evaluation value obtained from the third pattern shape satisfies a predetermined value; and
    a correcting part correcting at least one of the first and second design patterns if it is determined that the evaluation value does not satisfy the predetermined value.

18. The system according to claim 17, wherein the third calculating part calculates the third pattern shape using a Boolean operation between the first and second pattern shapes.

19. A computer readable medium configured to store program instructions applied to correcting a design pattern considering a process margin between layers of a semiconductor integrated circuit, the program instructions causing a computer to calculate a first pattern shape corresponding to a processed pattern shape of a first layer based on a first design pattern;

causing a computer to calculate a second pattern shape corresponding to a processed pattern shape of a second layer based on a second design pattern;

causing a computer to calculate a third pattern shape from the first and second pattern shapes;

causing a computer to determine whether or not an evaluation value obtained from the third pattern shape satisfies a predetermined value; and causing a computer to correct at least one of the first and second design patterns if it is determined that the evaluation value does not satisfy the predetermined value.

20. The computer readable medium according to claim 19, wherein causing a computer to calculate the third pattern shape includes causing a computer to calculate the third pattern shape using a Boolean operation between the first and second pattern shapes.

* * * * *

UNITED STATES PATENT AND TRADEMARK OFFICE
CERTIFICATE OF CORRECTION

PATENT NO. : 7,266,801 B2  Page 1 of 1
APPLICATION NO. : 11/012613
DATED : September 4, 2007
INVENTOR(S) : Kotani et al.

It is certified that error appears in the above-identified patent and that said Letters Patent is hereby corrected as shown below:

Claim 5, column 11, line 38, change "at lease one" to --at least one--.

Claim 15, column 12, line 18, change "a fist" to --a first--.

Claim 15, column 12, line 35, change "vale" to --value--.

Signed and Sealed this

Thirteenth Day of November, 2007

JON W. DUDAS
*Director of the United States Patent and Trademark Office*